(12) United States Patent
Park et al.

(10) Patent No.: US 9,954,155 B2
(45) Date of Patent: Apr. 24, 2018

(54) THERMOELECTRIC STRUCTURE, THERMOELECTRIC DEVICE AND METHOD OF MANUFACTURING THE SAME

(71) Applicants: Samsung Electronics Co., Ltd., Suwon-si, Gyeonggi-do (KR); Research & Business Foundation Sungkyunkwan University, Suwon-Si, Gyeonggi-Do (KR)

(72) Inventors: Seongjun Park, Seoul (KR); Hyeonjin Shin, Suwon-si (KR); Sungwng Kim, Seoul (KR); Eunsung Kim, Suwon-si (KR); Jaeyeol Hwang, Suwon-si (KR)

(73) Assignees: SAMSUNG ELECTRONICS CO., LTD, Gyeonggi-Do (KR); RESEARCH AND BUSINESS FOUNDATION SUNGKYUNKWAN UNIVERSITY, Gyeonggi-Do (KR)

(*) Notice: Subject to any disclaimer, the term of this patent is extended or adjusted under 35 U.S.C. 154(b) by 0 days.

(21) Appl. No.: 15/280,241

(22) Filed: Sep. 29, 2016

(65) Prior Publication Data
US 2017/0098749 A1    Apr. 6, 2017

(30) Foreign Application Priority Data
Oct. 1, 2015    (KR) .................. 10-2015-0138612

(51) Int. Cl.
*H01L 35/16* (2006.01)
*H01L 21/02* (2006.01)
(Continued)

(52) U.S. Cl.
CPC ........ *H01L 35/16* (2013.01); *H01L 21/02488* (2013.01); *H01L 21/02502* (2013.01);
(Continued)

(58) Field of Classification Search
None
See application file for complete search history.

(56) References Cited

U.S. PATENT DOCUMENTS 6,759,690 B2   7/2004 Miller
2004/0166357 A1  8/2004 Sakashita
(Continued)

FOREIGN PATENT DOCUMENTS

CN   103413889 A   11/2013
JP   H09256145 A   9/1997
(Continued)

OTHER PUBLICATIONS

Extended European Search report dated Mar. 7, 2017 issued in corresponding European Application No. 16188699.9-1555.
(Continued)

*Primary Examiner* — Andres Munoz
(74) *Attorney, Agent, or Firm* — Harness, Dickey & Pierce, PLC

(57) ABSTRACT

A thermoelectric structure that may be included in a thermoelectric device may include a thin-film structure that may include a plurality of thin-film layers. The thin-film structure may include Tellurium. The thin-film structure may be on a substrate. The substrate may include an oxide, and a buffer layer may be between the substrate and the thin-film structure. The thermoelectric structure may be manufactured via depositing material ablated from a target onto the substrate. Some material may react with the substrate to form the buffer layer, and thin film layers may be formed on the buffer layer. The thin film layers may be removed from the substrate and provided on a separate substrate. Removing the thin-film layers from the substrate may include removing the thin-film layers from the buffer layer.

14 Claims, 11 Drawing Sheets

(51) Int. Cl.
*H01L 35/34* (2006.01)
*H01L 35/10* (2006.01)
*H01L 35/18* (2006.01)

(52) U.S. Cl.
CPC .............. *H01L 35/10* (2013.01); *H01L 35/18* (2013.01); *H01L 35/34* (2013.01)

(56) References Cited

U.S. PATENT DOCUMENTS

2007/0039641 A1  2/2007  Hu et al.
2012/0186621 A1  7/2012  Kim et al.

FOREIGN PATENT DOCUMENTS

| JP | H1074985 A | 3/1998 |
| JP | WO2004/077562 | 9/2004 |
| KR | 10-2012-0039302 | 4/2012 |
| KR | 10-1469760 B1 | 12/2014 |

OTHER PUBLICATIONS

Sundararajan et al. Reactions of laser-ablated tellurium atoms with oxygen molecules: Matrix isolation infrared and DFT studies. Journal of Molecular Structure, Elsevier, Amsterdam, NL, vol. 876, No. 1-3, Mar. 12, 2008, pp. 240-249.

Rama Venkatasubramanian et al.; "Thin-film thermoelectric devices with high room-temperature figures of merit", Nature/vol. 413/Oct. 11, 2001, pp. 597-602.

Comparison between theoretical and experimental results

THERMOELECTRIC STRUCTURE, THERMOELECTRIC DEVICE AND METHOD OF MANUFACTURING THE SAME

CROSS-REFERENCE TO RELATED APPLICATION

This application claims the benefit of Korean Patent Application No. 10-2015-0138612, filed on Oct. 1, 2015, in the Korean Intellectual Property Office, the disclosure of which is incorporated herein in its entirety by reference.

BACKGROUND

1. Field

The present disclosure relates to thermoelectric structures, thermoelectric devices, and a method of manufacturing the same.

2. Description of the Related Art

Thermoelectric conversion refers to energy conversion between heat energy and electrical energy. If current flows into a thermoelectric material, a temperature gradient occurs between both ends of the thermoelectric material, and this effect is referred to as the Peltier effect. A reverse of the Peltier effect is electricity being generated when a temperature difference between both ends of a thermoelectric material occurs, and this effect is referred to as the Seebeck effect.

Various cooling systems that do not need a refrigerant may be implemented by using the Peltier effect. A cooling system using the Peltier effect may be usefully applied to resolve a heating problem that may not be resolved by using a cooling system in the related art (a passive cooling system, a refrigerant gas compressing system, or the like). Thermoelectric cooling technology is an environmentally friendly cooling technology that does not employ refrigerant gas which causes environmental problems. If thermoelectric cooling efficiency is enhanced by developing a highly-efficient thermoelectric cooling material, the thermoelectric cooling technology may be widely applied to general-use cooling areas such as refrigerators, air conditioners, or the like.

Heat generated from a computer, a vehicle engine, or an industrial factory may be converted into electrical energy, by using the Seebeck effect. Thermoelectric power generation using the Seebeck effect may be utilized as a new-generation energy source. Recently, as interest in new energy development, waste energy recovery, and environment protection has increased, interest in a thermoelectric device has also increased.

SUMMARY

Some example embodiments include methods of manufacturing thermoelectric structures and thermoelectric devices by forming a tellurium-based thin-film structure having low heat conductivity on an oxide substrate by using a simple method.

Some example embodiments include the thermoelectric structures and the thermoelectric devices.

Additional aspects will be set forth in part in the description which follows and, in part, will be apparent from the description, or may be learned by practice of the presented example embodiments.

According to some example embodiments, a method of manufacturing a thermoelectric structure includes: emitting laser light toward a target to separate at least first and second portions of a material from the target, the target including tellurium (Te); forming a buffer layer based on depositing the first portion of the material on an oxide substrate, the buffer layer including tellurium oxide; and forming a thin-film structure based on depositing the second portion of the material on the buffer layer, the thin-film structure including Te.

The emitting of the laser light may include emitting pulsed laser light having a frequency ranging from about 0.5 Hz to about 4 Hz.

The emitting of the laser light toward the target may include emitting the laser light toward the target by using a krypton fluoride (KrF) excimer laser apparatus.

Emitting the laser light toward the target may include applying an amount of energy to the target using the laser light. The amount of energy may be equal to or less than about 45 mJ.

The forming of the thin-film structure may include forming a thin-film structure having a thickness of about 10 nm to about 100 nm within a period of elapsed time, the period of elapsed time being equal to or less than about 2 hours.

The thin-film structure may have a heat conductivity in a direction of a thickness of the thin-film structure. The heat conductivity may be about 0.14 W/(m.1) to about 0.3 W/(m.3).

The thin-film structure may have a full width at half maximum (FWHM) that is equal to or less than about 0.1 degrees.

The target may further include at least one of bismuth (Bi), antimony (Sb), and selenium (Se).

The thin-film structure may include a plurality of thin-film layers, and the plurality of thin-film layers may be stacked in a direction of a thickness of each of the plurality of thin-film layers.

Each of the plurality of thin-film layers may include $Bi_{0.5}Sb_{1.5}Te_3$.

The buffer layer may include a first buffer layer on the oxide substrate and including tellurium oxide, and a second buffer on the first buffer layer and including Te.

The buffer layer may have a thickness that may be about 0.2 nm to about 2 nm.

The method may further include separating the thin-film structure from the buffer layer.

The method may further include placing the separated thin-film structure on a separate substrate having a material that different from the oxide substrate.

According to some example embodiments, a thermoelectric structure includes: an oxide substrate; a thin-film structure on the oxide substrate and including tellurium (Te); and a buffer layer between the oxide substrate and the thin-film structure, wherein at least a part of the buffer layer includes tellurium oxide.

The thin-film structure may have a thickness that may be about 10 nm to about 100 nm.

The thin-film structure may have a heat conductivity in a direction of a thickness of the thin-film structure. The heat conductivity may be about 0.14 W/(m.1) to about 0.3 W/(m0.).

The thin-film structure may have a full width at half maximum (FWHM) that may be about 0.1 degrees.

The thin-film structure may further include at least one of bismuth (Bi), antimony (Sb), and selenium (Se).

The thin-film structure may include a plurality of thin-film layers, and the plurality of thin-film layers may be stacked in a direction of a thickness of each of the plurality of thin-film layers.

Each of the plurality of thin-film layers may include $Bi_{0.5}Sb_{1.5}Te_3$.

The buffer layer may include a first buffer layer on the oxide substrate and including tellurium oxide, and a second buffer on the first buffer layer and including Te.

A thickness of the buffer layer may be about 0.2 nm to about 2 nm.

According to some example embodiments, a thermoelectric device includes a thermoelectric structure. The thermoelectric structure may include a substrate and a thin-film structure on the substrate. The thin-film structure may include tellurium (Te). Heat conductivity of the thin-film structure in a direction of thickness of the thin-film structure may be about 0.14 W/(m.1) to about 0.3 W/(m.3). A full width at half maximum (FWHM) of the thin-film structure may be equal to or less than about 0.1 degrees.

The thermoelectric device may include a power apparatus coupled to the thermoelectric structure through one or more electrical leads. The power apparatus may be configured to supply electrical current to the thermoelectric structure. The thermoelectric structure may be configured to generate a temperature gradient between opposite ends of the thermoelectric structure based on the supplied electrical current.

The thermoelectric device may include an electronic apparatus coupled to the thermoelectric structure through one or more electrical leads. The thermoelectric structure may be configured to induce an electrical current through the electronic apparatus based on a temperature gradient between opposite ends of the thermoelectric structure.

The thin-film structure may include a plurality of thin-film layers. The plurality of thin-film layers may be stacked in a direction of a thickness of each of the plurality of thin-film layers.

Each of the plurality of thin-film layers may include $Bi_{0.5}Sb_{1.5}Te_3$.

According to some example embodiments, a thermoelectric structure includes a buffer layer and a thin-film structure on the buffer layer. The buffer layer may include tellurium oxide. The thin-film structure may include a plurality of thin-film layers that may be stacked in a direction of a thickness of each of the plurality of thin-film layers. The thin-film structure may include a plurality of thin-film layers that may be stacked in a direction of a thickness of each of the plurality of thin-film layers. The thin-film layers may include tellurium.

The thin-film structure may have a thickness that is about 10 nm to about 100 nm.

The thin-film structure may have a heat conductivity in a direction of a thickness of the thin-film structure. The heat conductivity may be about 0.14 W/(m(m) to about 0.3 W/(m0.).

The thin-film structure may have a full width at half maximum (FWHM) that is equal to or less than about 0.1 degrees.

The buffer layer may include a first buffer layer on the oxide substrate and a second buffer layer on the first buffer layer. The first buffer layer may include tellurium oxide. The second buffer layer may include tellurium (Te).

Each of the plurality of thin-film layers may include $Bi_{0.5}Sb_{1.5}Te_3$.

BRIEF DESCRIPTION OF THE DRAWINGS

These and/or other aspects will become apparent and more readily appreciated from the following description of example embodiments, taken in conjunction with the accompanying drawings in which.

Figure 1A:
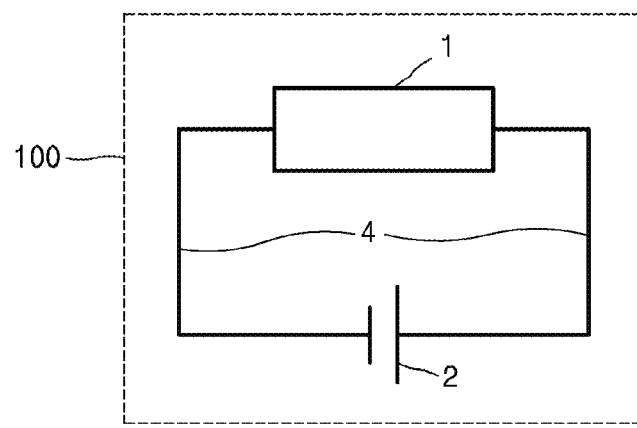
FIG. 1A and FIG. 1B illustrate a thermoelectric device according to some example embodiments.

It should be noted that these figures are intended to illustrate the general characteristics of methods and/or structure utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments.

DETAILED DESCRIPTION

Reference will now be made in detail to example embodiments, one or more of which are illustrated in the accompanying drawings, wherein like reference numerals refer to like elements throughout, and thus descriptions will not be repeated. In this regard, the present example embodiments may have different forms and should not be construed as being limited to the descriptions set forth herein. Rather, the illustrated embodiments are provided as examples so that this disclosure will be thorough and complete, and will fully convey the concepts of this disclosure to those skilled in the art. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), an application-specific integrated circuit (ASIC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description.

However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Hereinafter, according to some example embodiments, a thermoelectric structure and a method of manufacturing the same will be described more fully with reference to the accompanying drawings, in which some example embodiments are shown. Like reference numerals in the drawings denote like elements. In the drawings, the lengths and sizes of components may be exaggerated for clarity and convenience of description. Example embodiments, described herein, are only examples, and various modifications and changes in the example embodiments may be made.

Figure 1B:
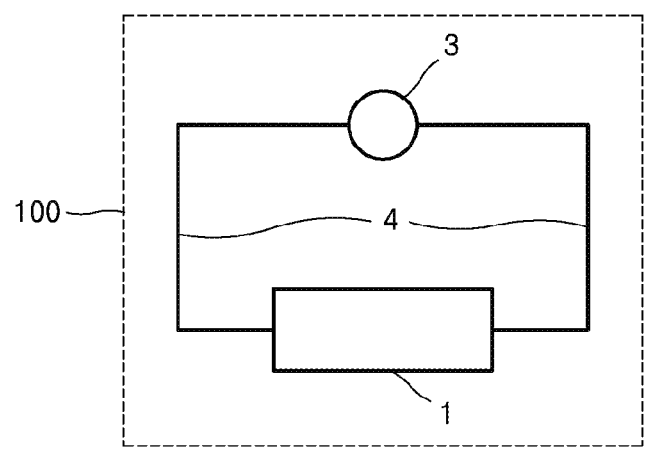

FIG. 1A and FIG. 1B illustrate a thermoelectric device 100 according to some example embodiments. In the example embodiment illustrated in FIG. 1A, the thermoelectric device 100 includes a thermoelectric structure 1 coupled to a power apparatus 2 through electrical leads 4. In the example embodiment illustrated in FIG. 1B, the thermoelectric device 100 includes a thermoelectric structure 1 coupled to an electronic apparatus 3 through electrical leads 4. The electronic apparatus 3 may consume electrical power supplied to the electronic apparatus 3 via an electrical current induced through the electronic apparatus 3.

The thermoelectric structure 1 refers to a structure that may perform thermoelectric conversion. In other words, the thermoelectric structure 1 may convert heat energy into electrical energy. In some example embodiments, the thermoelectric structure may convert electrical energy into heat energy.

An effect in which, if current flows into the thermoelectric structure 1, a temperature gradient (or temperature difference) occurs between opposite ends of the thermoelectric structure 1 is referred to as a Peltier effect. As a reverse of the Peltier effect, an effect in which electricity is generated when a temperature difference between opposite ends of the thermoelectric structure 1 occurs is referred to as a Seebeck effect.

As an example, referring to FIG. 1A, a power apparatus 2 may supply current to the thermoelectric structure 1 by using the Peltier effect. In some example embodiments, the thermoelectric structure 1 may be used as a cooling system based upon being supplied current from the power apparatus 2 via electrical leads 4, as the thermoelectric structure 1 may generate a temperature gradient based on the supplied current.

As another example, referring to FIG. 1B, the thermoelectric structure 1 may convert heat into electrical energy, and use the electrical energy as an energy source by using the Seebeck effect. For example, still referring to FIG. 1B, the thermoelectric structure 1 may use heat to induce an electrical current through electronic apparatus 3 via electrical leads 4. Thus, an electronic apparatus 3 may be driven by using the thermoelectric structure 1.

Performance of the thermoelectric structure may be indicated by a thermoelectric conversion efficiency of the thermoelectric structure 1. An index indicating a thermoelectric conversion efficiency of the thermoelectric structure 1 is a thermoelectric performance index zT.

The thermoelectric performance index zT is defined as follows:

$$zT = (\alpha 2\sigma T)/\kappa \qquad (1)$$

where α represents a Seebeck coefficient, σ represents electrical conductivity, T represents an absolute temperature, and κ represents heat conductivity. In Equation (1) shown above, α2σ represents a power factor.

Referring to the Equation (1) shown above, a Seebeck coefficient and electrical conductivity may be increased and heat conductivity may be decreased, so as to increase a thermoelectric performance index.

If and/or when a thermoelectric structure 1 has a bulk form, since the Seebeck coefficient, the electrical conductivity, and the heat conductivity are not independent variables but may affect each other, a thermoelectric performance index may not be easily increased.

According to some example embodiments, a thermoelectric structure 1 that includes a thin-film structure in the form of a thin film may have reduced heat conductivity, compared to a thermoelectric structure in a bulk form, as phonon scattering increases at a grain boundary and an interlayer boundary in a direction of thickness of the thermoelectric structure 1. In addition, a trade-off relationship between the Seebeck coefficient and electric conductivity may be broken due to a quantum confinement effect or a carrier filtering effect. Thus, a thermoelectric performance index may be increased if and/or when the thermoelectric structure 1 includes a thin-film structure.

Figure 2:
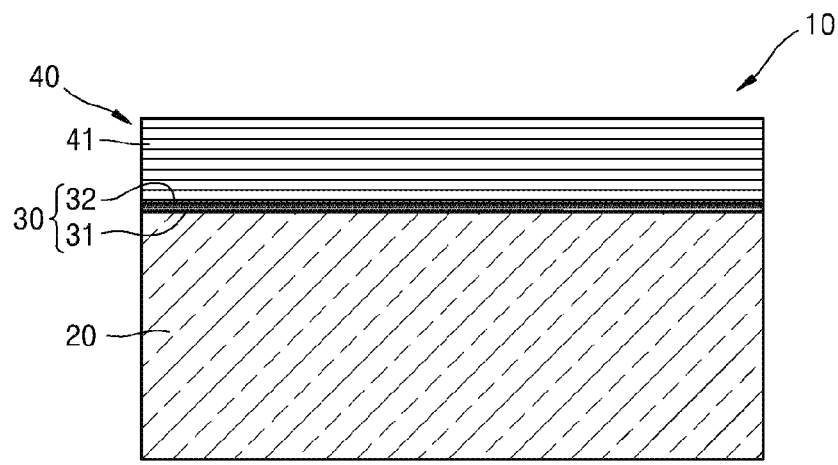
FIG. 2 is a conceptual diagram of a cross-sectional view of a thermoelectric structure according to some example embodiments.

FIG. 2 is a conceptual diagram of a cross-sectional view of a thermoelectric structure 10 according to some example embodiments.

Referring to FIG. 2, the thermoelectric structure 10 includes an oxide substrate 20, a thin-film structure 40, and a buffer layer 30 disposed therebetween.

The oxide substrate 20 may include at least one of aluminum oxide (Al2O3), zinc oxide (ZnO), and magnesium oxide (MgO). As an example, at least a part of the oxide substrate 20 may include aluminum oxide (Al2O3). For example, the whole oxide substrate 20 may include Al2O3, and thus, be referred to as an Al2O3 oxide substrate.

The thin-film structure 40 may be disposed on the oxide substrate 20. For example, the thin-film structure 40 may be disposed on the oxide substrate 20 via the buffer layer 30 that is to be described later. The thin-film structure 40 may include tellurium (Te). The thin-film structure 40 may further include at least one of bismuth (Bi), antimony (Sb), and selenium (Se). As an example, the thin-film structure 40 may include Te and Bi. The thin-film structure 40 may include Sb or Se in addition to Te and Bi.

The thin-film structure 40 may be a structure that may be configured to perform thermoelectric conversion. In other words, the thermoelectric structure 10 may be configured to convert heat energy into electrical energy, or convert electrical energy into heat energy.

The thin-film structure 40 may include a plurality of thin-film layers 41. The thin-film structure 40 may include a Te-based material. For example, the plurality of thin-film layers 41 may further include at least one of Sb, Se, and Bi, in addition to Te. For example, the plurality of thin-film layers 41 may include Te, Sb, and Bi. For example, a material of the plurality of thin-film layers 41 may be $(Bi_xSb_{1-x})_2Te_3$ (where 0<x<1). For example, a material of the plurality of thin-film layers 41 may be $Bi_{0.5}Sb_{1.5}Te_3$.

The buffer layer 30 may be disposed on the oxide substrate 20. The buffer layer 30 may be disposed between the oxide substrate 20 and the thin-film structure 40. A thickness of the buffer layer 30 may be about 0.2 nm to about 2 nm.

The buffer layer 30 may be formed while the thin-film structure 40 is formed on the oxide substrate 20. A detailed method of forming the buffer layer 30 is to be described later.

The buffer layer 30 may include a part of materials of the oxide substrate 20 and a part of materials of the thin-film structure 40. For example, the buffer layer 30 may include oxygen (O) in the oxide substrate 20 and Te in the thin-film structure 40. For example, the buffer layer 30 may include tellurium oxide.

The buffer layer 30 may include a plurality of layers. For example, the buffer layer 30 may include a first buffer layer 31 and a second buffer layer 32.

The first buffer layer 31 is disposed on the oxide substrate 20, and contacts the oxide substrate 20. The second buffer layer 32 is disposed on the first buffer layer 31 and contacts the first buffer layer 31 and the thin-film structure 40. The second buffer layer 32 is disposed between the first buffer layer 31 and the thin-film structure 40.

The first buffer layer 31 may include tellurium oxide. A lattice mismatch between the oxide substrate 20 and the first buffer layer 31 may be smaller than a lattice mismatch between the oxide substrate 20 and the thin-film structure 40.

The second buffer layer 32 may include Te. If the plurality of thin-film layers 41 in the thin-film structure 40 includes Bi, Sb, and Te, Te may be located in a lower part of the plurality of thin-film layers 41 in a crystal structure. Since the Te located in the lower part of the thin-film layer 41 combines with Te in the second buffer layer 32, generation of a lattice mismatch between the plurality of thin-film layers 41 and the buffer layer 30 may be reduced or prevented.

As an example, if the oxide substrate 20 includes Al2O3, and the thin-film structure 40 includes $Bi_{0.5}Sb_{1.5}Te_3$, a lattice mismatch between the oxide substrate 20 and the thin-film structure 40 may be about 9.5%. A lattice mismatch between the oxide substrate 20 and the first buffer layer 31 that includes tellurium oxide may be about 4.7%.

As described above, a problem that may be caused by a lattice mismatch between the oxide substrate 20 and the thin-film structure 40 may be eased or resolved by disposing the buffer layer 30 between the oxide substrate 20 and the thin-film structure 40. Thus, crystallization of the whole thin-film structure 40 formed on the oxide substrate 20 may be enhanced and, accordingly, a difference in thickness between the plurality of thin-film layers 41 may be reduced.

A thickness of the whole thin-film structure 40 may be 10 nm to 100 nm. A thickness of each thin-film layer 41 may be 1 nm to 5 nm. Heat conductivity (K) may be about 0.14 W/(m·K) to about 0.3 W/(m·K). A full width at half maximum (FWHM) of the thin-film structure 40 which is obtained by performing omega (ω) scanning may be equal to or less than about 0.1 degrees.

Hereinafter, a method of manufacturing the thermoelectric structure 10 is described.

Figure 3:
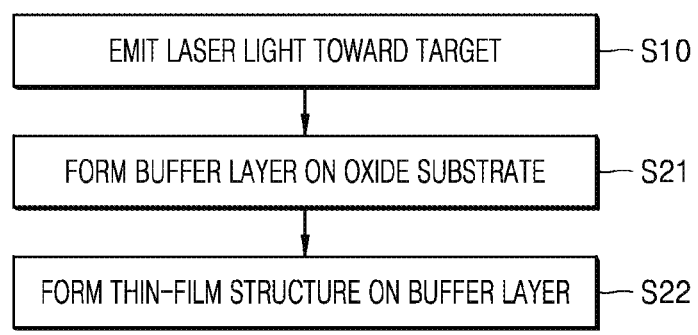
FIG. 3 is a flowchart of a method of manufacturing a thermoelectric structure according to some example embodiments.
Figure 4:
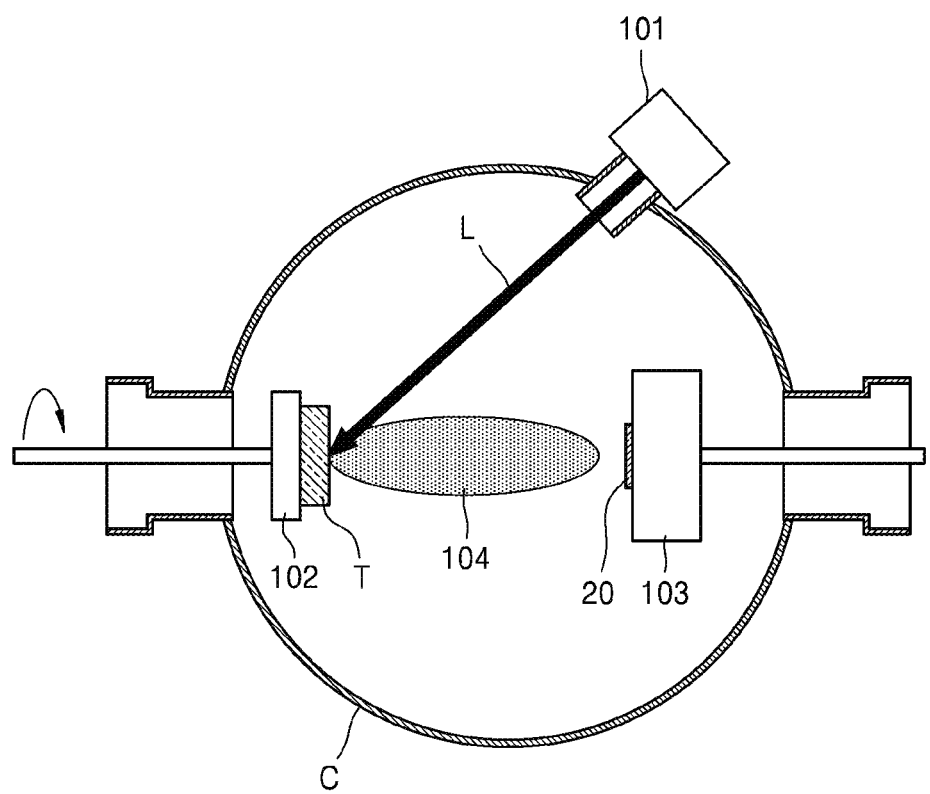
FIG. 4 is a flowchart illustrating a method of manufacturing a thermoelectric structure according to some example embodiments.

FIG. 3 is a flowchart of a method of manufacturing a thermoelectric structure 10 according to some example embodiments. FIG. 4 is a flowchart illustrating a method of manufacturing a thermoelectric structure 10 according to some example embodiments.

Referring to FIG. 3 and FIG. 4, a target T that includes a material to be deposited on the oxide substrate 20. The target T includes Te. The target T may further include at least one of Bi, Sb, and Se. For example, the target T may include Te, Bi, and Sb. For example, the target T may include $Bi_{0.5}Sb_{1.5}Te_3$.

Referring to FIG. 4, laser light L may be emitted toward the target T by using a pulsed laser deposition method. Material may be vaporized from the target T based on the laser light L impinging on a surface of the target T. For example, the impinging laser light L may transfer an amount of energy into the target T. A portion of material may be vaporized from the target based on the transferred amount of energy. Such vaporization may be referred to as laser ablation of the target T. The vaporized material may form a laser plume 104 that is at least partially deposited on an oxide substrate 20. Thus, the thin-film structure 40 may be deposited on the oxide substrate 20. The laser plume 104, in some example embodiments, is a plasma.

The target T is disposed on a target support 102 in a chamber C and the oxide substrate 20 is disposed on a substrate support 103 in the chamber C. The oxide substrate 20 supported by the substrate support 103 may be in a state of being heated. At least one of the target support 102 and the substrate support 103 may have a tilted or rotatable structure. However, the tilted or rotatable structure of the target support 102 and the substrate support 103 is only an example. A structure of the target support 102 and the substrate support 103 is not limited thereto, and may be variously modified.

Referring to FIG. 3, at S10, a laser apparatus 101 emits the laser light L toward the target T supported by the target support 102. The laser apparatus 101 may emit the laser light L by using an excimer laser apparatus. The excimer laser apparatus may be a krypton fluoride (KrF) excimer laser apparatus. A wavelength of the excimer laser apparatus may be about 248 nm.

The laser apparatus 101 may emit pulsed laser light having a low frequency. For example, the laser apparatus 101 may emit pulsed laser light having a frequency ranging from about 0.5 Hz to about 4 Hz.

The laser apparatus 101 may be set or designed to emit a relatively small amount of energy toward the target T. For example, the amount of energy emitted toward the target T by the laser apparatus 101 may be equal to or less than about 45 mJ. In another example, energy emitted toward the target T by the laser apparatus 101 may be about 25 mJ to about 45 mJ.

As described above, if the laser light L having a low frequency and low energy is emitted toward the target T, the high crystalline thin-film structure 40 in correspondence with a composition of the target T may be deposited on the oxide substrate 20 based on vaporization of one or more portions of material from the target T. It will be understood that vaporization of a material from the target T may be referred to as separation of the material from the target T, evaporation of the material from the target T, etc. without being explicitly stated as such.

If the laser light L having a high frequency and/or high energy is emitted toward the target T, a Te-based material in a bulk form may be vaporized from the target T. The Te-based material may not be deposited on the oxide substrate 20 to have an even thin-film form.

According to some example embodiments, a Te-based material in the units of an atom is separated or evaporated from the target T by emitting the laser light L having a low frequency toward the target T, and the separated or evaporated Te-based material is deposited on the oxide substrate 20 in the form of a thin film.

At operation S21, if and/or when the Te-based material is deposited on the oxide substrate 20, the Te-based material may react with the oxide substrate 20 to form the buffer layer 30 that includes tellurium oxide. For example, the first buffer layer 31 that includes tellurium oxide and the second buffer layer 32 that includes Te may be formed on the oxide substrate 20.

At operation S22, as the laser light L continues being emitted toward the target T subsequent to formation of the buffer layer 30, the thin-film structure 40 is formed on the buffer layer 30 based on continued vaporization of material from the target T by the laser light L. The thin-film structure 40 may include a material included in the target T. For example, if the target T includes Te, Bi, and Sb, the thin-film structure 40 may include Te, Bi, and Sb.

The thin-film structure 40 may include the plurality of thin-film layers 41. The plurality of thin-film layers 41 may be formed to have a same thickness.

As described above, if and/or when the buffer layer 30 that includes tellurium oxide is formed and the thin-film structure 40 is formed on the oxide substrate 20, the thin-film structure 40 may be epitaxially grown. The thin-film structure 40 may have high crystallization. For example, heat conductivity (K) in a direction of a thickness of the thin-film structure 40 may range from about 0.14 W/(m·K) to about 0.3 W/(m·K). A FWHM of the thin-film structure 40 may be equal to or less than about 0.1 degrees. The FWHM may be obtained according to omega (ω) scanning.

As described above, the thin-film structure 40 having a certain thickness or greater may be deposited on the oxide substrate 20 within a short period of time, by forming the thin-film structure 40 on the oxide substrate 20 by using a pulsed laser deposition method. For example, the thin-film structure 40 having a thickness ranging from about 10 nm to about 100 nm may be formed on the oxide substrate 20 within two hours.

EXAMPLE EMBODIMENT

A mixture may be prepared by mixing raw metal materials including one or more of Bi, Sb, and Te with each other in correspondence with a composition ratio therebetween, so as to obtain a thermoelectric material having a composition equation of $Bi_{0.5}Sb_{1.5}Te_3$. The prepared mixture may be put into a quartz tube and sealed, and then, melted at a temperature of about 1000° C. for 10 hours. Then, the prepared mixture is maintained at a temperature of about 650° C. for two hours, and then, the temperature is reduced by using water at a room temperature. Thus, a thermoelectric structure of $Bi_{0.5}Sb_{1.5}Te_3$ in an ingot form may be manufactured.

After 10 g of the thermoelectric material in the ingot form is manufactured, the thermoelectric material is evenly ground at about 1425 rpm for two minutes by using a high-energy ball mill, and thus, a powder of the thermoelectric material is manufactured.

The target T for thin-film deposition is manufactured by sintering the powder at a temperature of about 480° C. for two minutes under a pressure of about 70 Mpa in a vacuum state by using a spark plasma sintering method.

The laser light L may be applied to the manufactured target T by using a pulsed laser deposition method, and thus, $Bi_{0.5}Sb_{1.5}Te_3$ is deposited on the Al2O3 oxide substrate 20 in the form of a thin film for about 1.5 hours.

Figure 5:
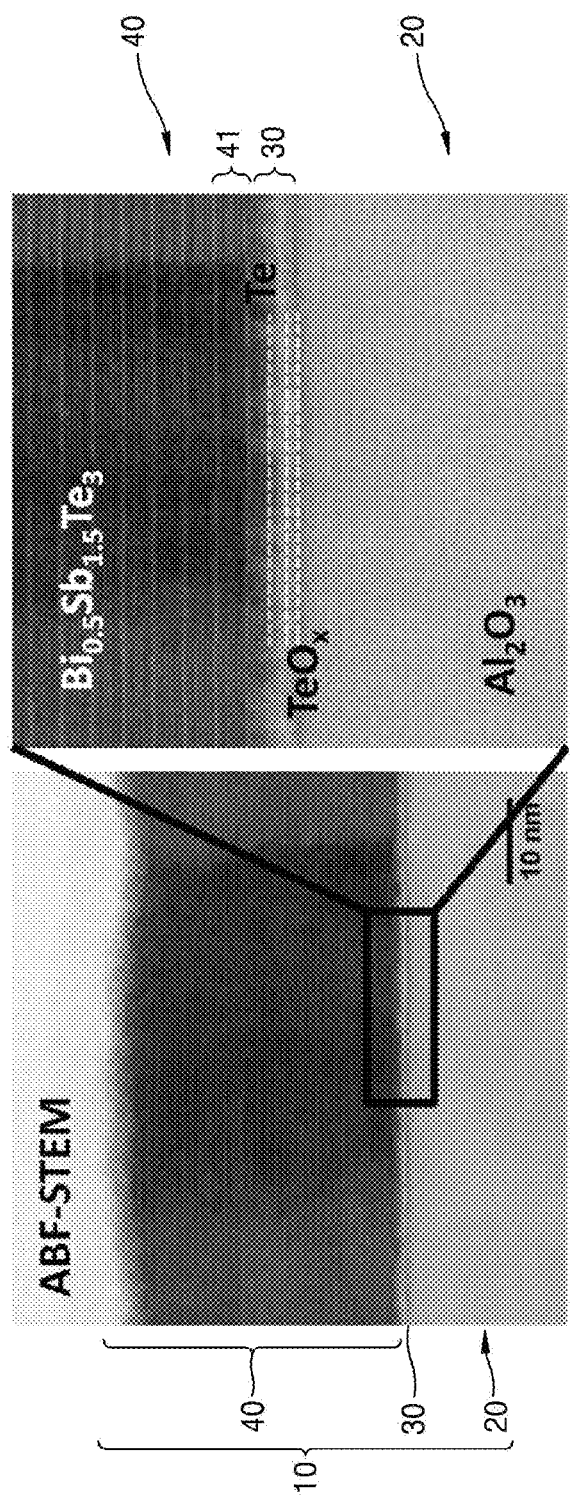
FIG. 5 illustrates an image obtained by observing a manufactured thermoelectric structure by using an optical electronic microscope, according to some example embodiments.
Figure 6:
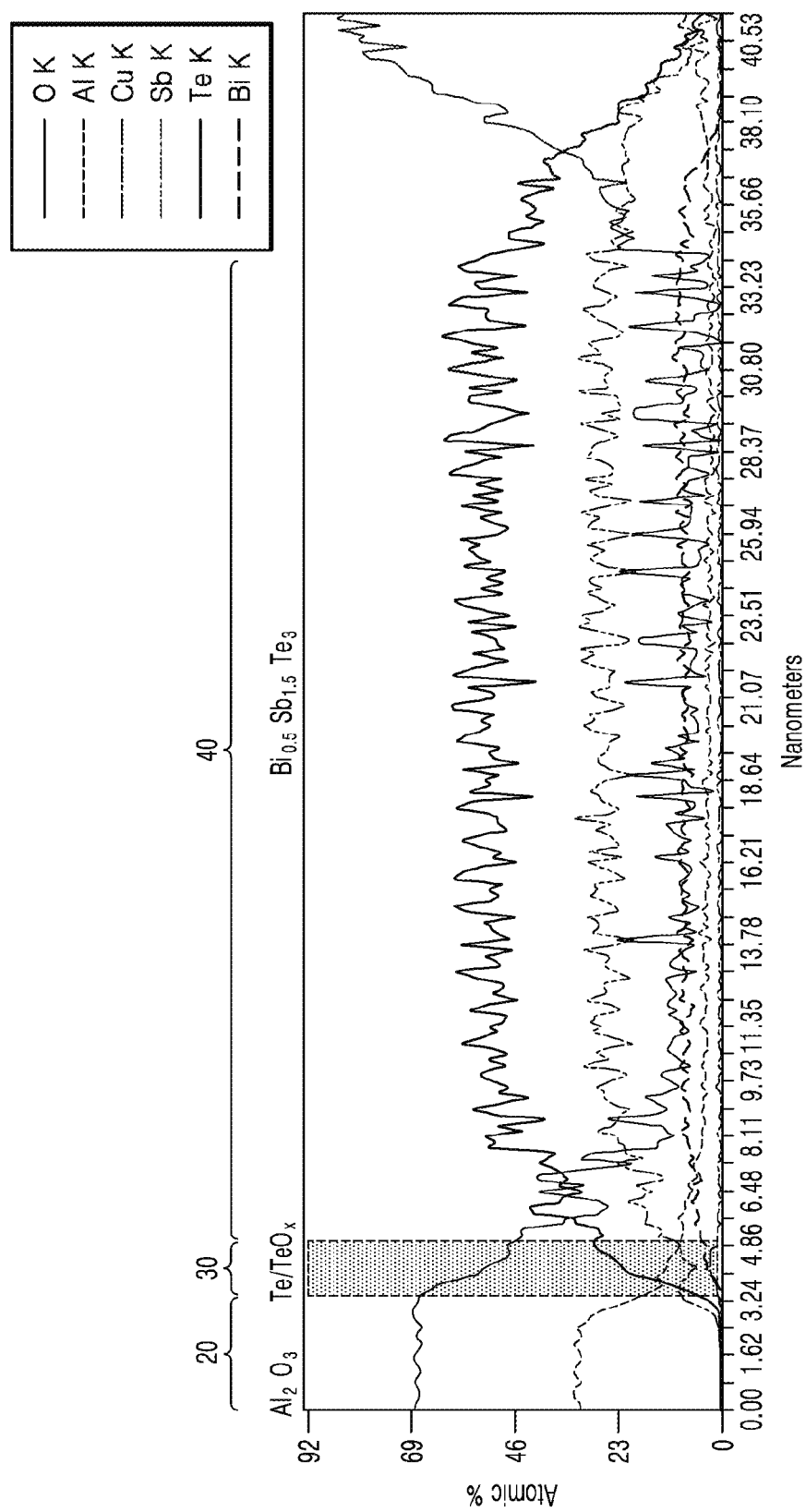
FIG. 6 is a graph showing a result of measuring a chemical element in a direction of a thickness of the thermoelectric structure according to energy dispersive X-ray (EDX) spectroscopy analysis, according to some example embodiments.

FIG. 5 illustrates an image obtained by observing the manufactured thermoelectric structure 10 by using an optical electronic microscope, according to some example embodiments. FIG. 6 is a graph showing a result of measuring a chemical component in a direction of a thickness of the thermoelectric structure 10 according to an energy dispersive X-ray (EDX) analysis.

Referring to FIG. 5 and FIG. 6, it may be determined that the buffer layer 30 that includes tellurium oxide (TeOx, where x is a positive number) is formed between the Al2O3 oxide substrate 20 and the thin-film structure 40 that is formed of
$Bi_{0.5}Sb_{1.5}Te_3$.

Referring to FIG. 6, it may be understood that the buffer layer 30 containing Te and O is formed between the oxide substrate 20 containing aluminum (Al) and O and the thin-film structure 40 containing Bi, Sb, and Te. The buffer layer 30 has a thickness of about 1.6 nm.

Characteristics of the thin-film structure 40, formed on the buffer layer 30, may be measured and/or observed. The characteristics of the thin-film structure 40 are described with reference to FIG. 7A, FIG. 7B, FIG. 7C, FIG. 8A, FIG. 8B, FIG. 9, and FIG. 10.

Figure 7A:
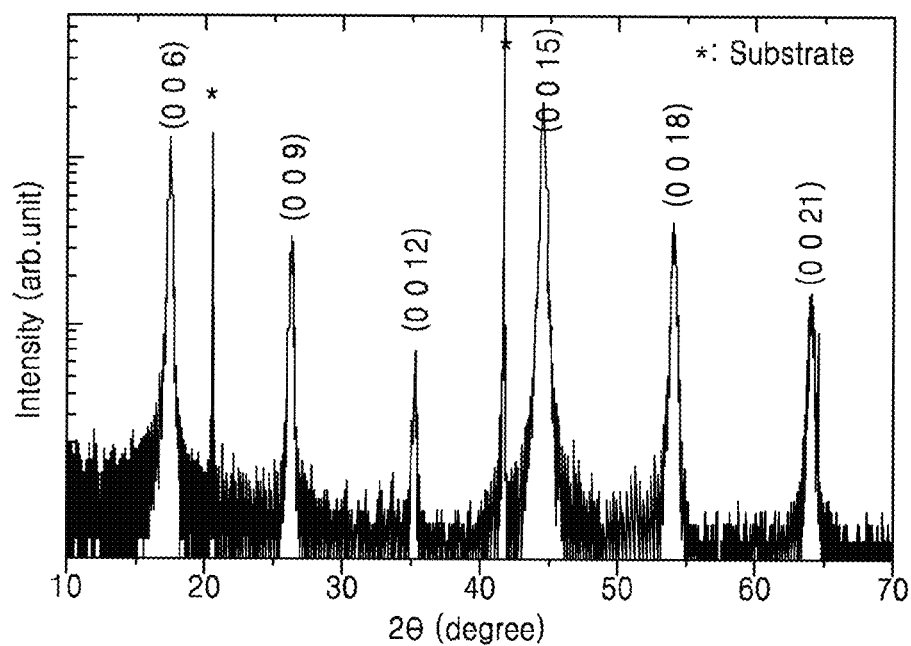
FIG. 7A, FIG. 7B, and FIG. 7C are graphs showing results of two-theta ($2\theta$) scanning, omega ($\omega$) scanning, and phi ($\varphi$) scanning of the thin-film structure 40, respectively.
Figure 7B:
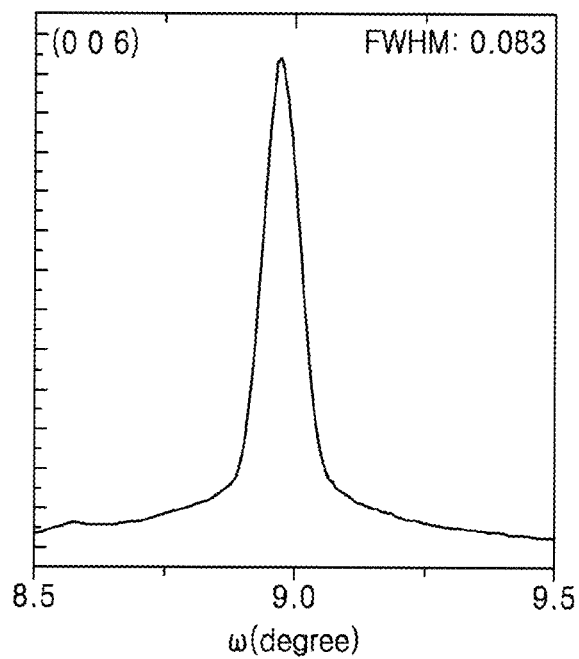
Figure 7C:
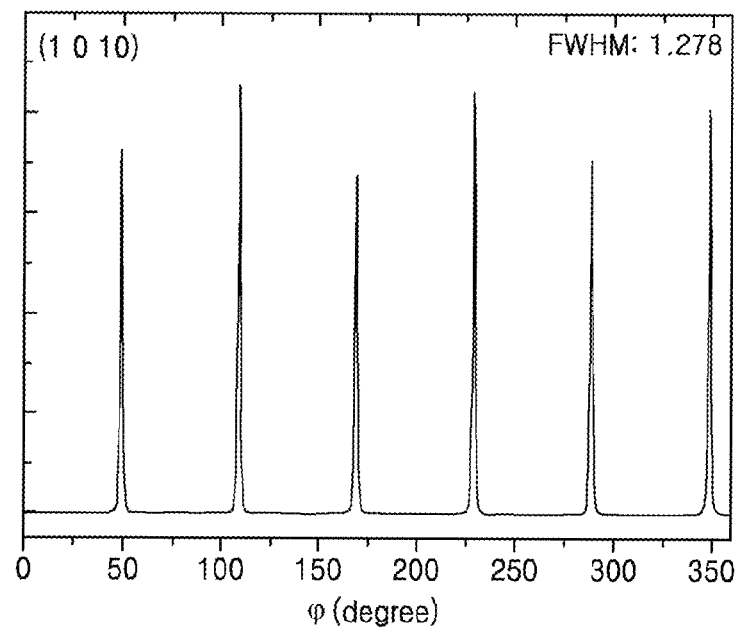
Figure 8A:
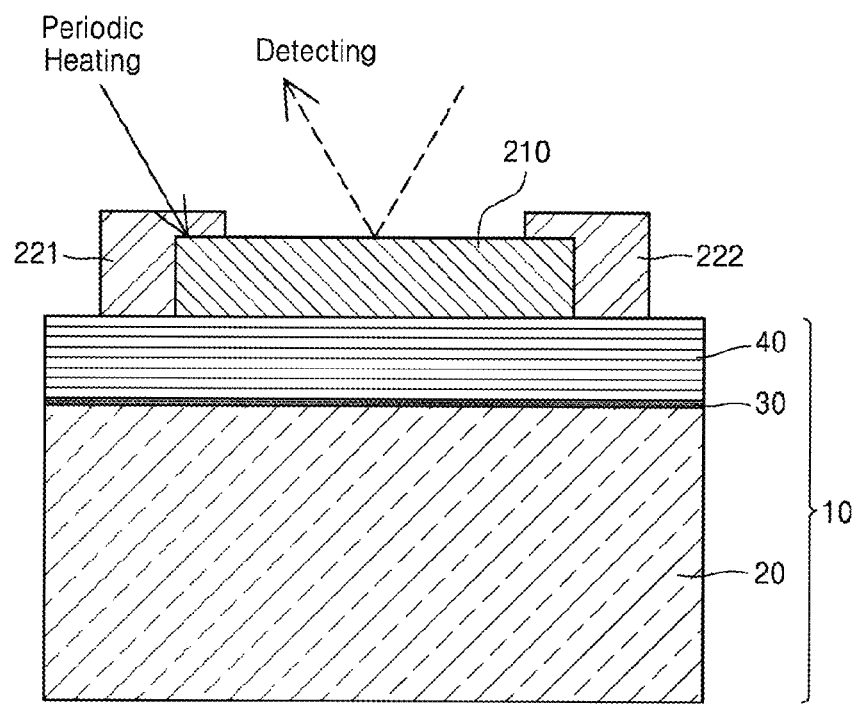
FIG. 8A illustrates a conceptual diagram of a measuring apparatus for measuring heat conductivity of the thin-film structure, according to some example embodiments.
Figure 8B:
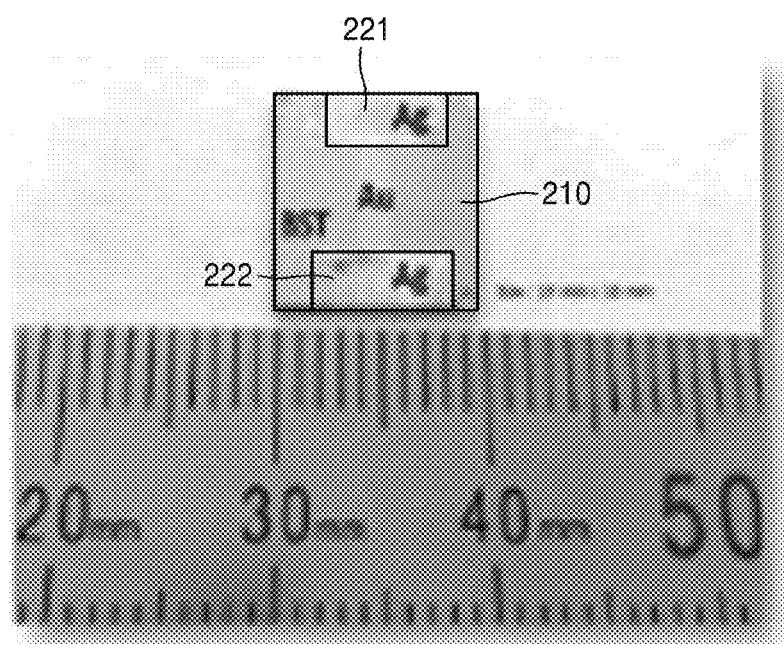
FIG. 8B is a photograph of the measuring apparatus shown in FIG. 8A, taken in a downward direction from above.
Figure 9:
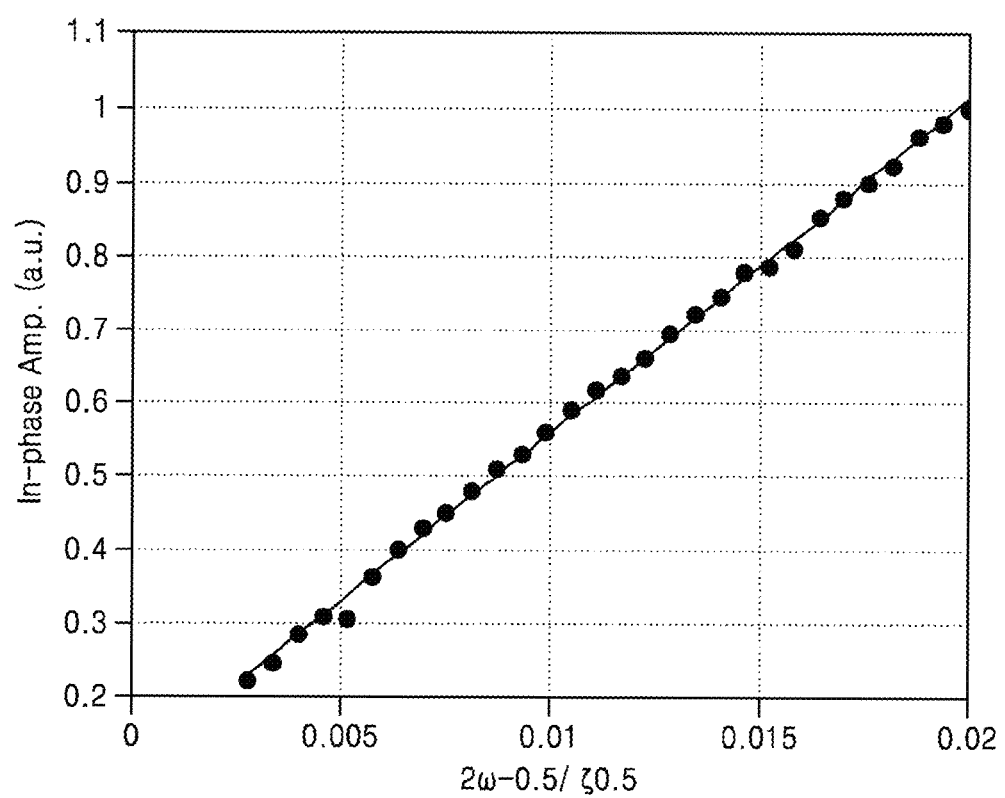
FIG. 9 is a graph showing a state of the measuring apparatus shown in FIG. 8A.
Figure 10:
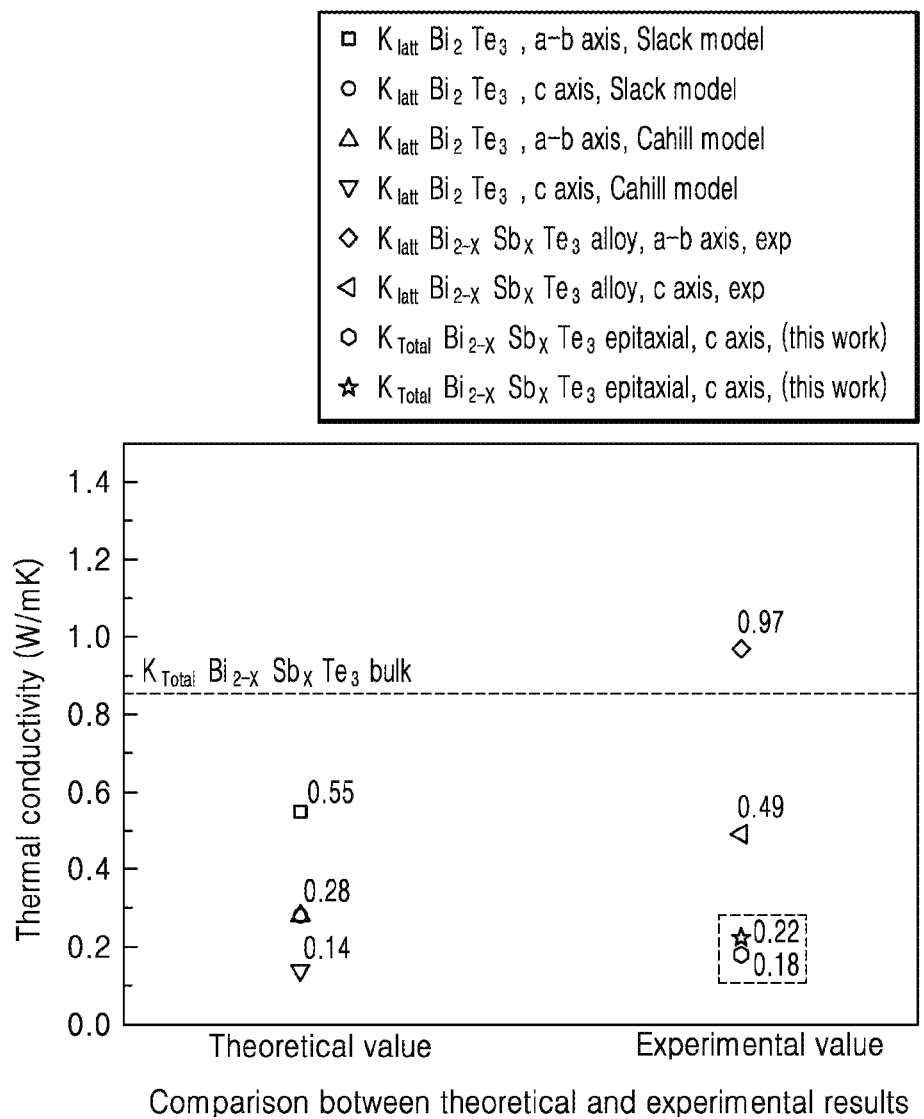
FIG. 10 is a graph showing heat conductivity of the thin-film structure according to some example embodiments.

FIG. 7A, FIG. 7B, and FIG. 7C are graphs showing results of two-theta (2θ) scanning, omega (ω) scanning, and phi (φ) scanning of the thin-film structure 40, respectively. FIG. 8A illustrates a conceptual diagram of a measuring apparatus for measuring heat conductivity of the thin-film structure 40. FIG. 8B is a photograph of the measuring apparatus shown in FIG. 8A, taken in a downward direction from above. FIG. 9 is a graph showing a state of the measuring apparatus shown in FIG. 8A. FIG. 10 is a graph showing heat conductivity of the thin-film structure according to some example embodiments.

Referring to FIG. 7A, FIG. 7B, and FIG. 7C, occurrence of a peak with a certain interval may be observed from a result obtained by 2θ-scanning the thin-film structure 40. Thus, it may be understood that the plurality of thin-film layers 41 are formed to have a same thickness. Additionally, an FWHM obtained by w-scanning the thin-film structure 40 is 0.083 degrees. Thus, it may be understood that crystallization of the thin-film structure 40 is enhanced.

Referring to FIG. 8A and FIG. 8B, a metal thin-film 210 formed of gold (Au) and electrodes 221 and 222 formed of silver (Ag) are disposed on the thermoelectric structure 10. In such a structure, heat may be periodically applied to the metal thin film 210 so as to measure heat conductivity (K) of the thin-film structure 40.

The measuring apparatus may measure the heat conductivity (K) of the thin-film structure 40 over a range of electrical conductivity as shown in FIG. 9. In other words, the measuring apparatus measures the heat conductivity (K) of the thin-film structure 40 when the measuring apparatus is stable.

Referring to FIG. 10, with respect to 200 or more thin-film structures 40 manufactured by using the method described above, heat conductivity thereof in a direction of a c-axis is measured. The heat conductivity, obtained as a result of the measuring, is about 0.18 W/(m·K) to about 0.22 W/(m·K). A thickness of the 200 or more thin-film structure 40 is about 30 nm.

Unlike the example, in a comparative example, if a thin-film structure is formed on an oxide substrate and does not include the buffer layer 30 that includes tellurium oxide, when a thickness of the thin-film structure is 5 nm, heat conductivity of the thin-film structure in a c-axis is about 0.49 W/(m·K), and heat conductivity of the thin-film structure in an a-b axis is about 0.97 W/(m·K).

The heat conductivity of the thin-film structure in the a-b axis may be greater than the heat conductivity of the thin-film structure in the c-axis. Accordingly, if a thickness is increased, the heat conductivity of the thin-film structure in the c-axis is affected by the heat conductivity of the thin-film structure in the a-b axis, and thus, increased. However, it may be understood that the thin-film structure 40 in the example embodiment has a greater thickness than that of the thin-film structure in the comparative example, and that heat conductivity of the thin-film structure 40 in a c-axis is less than half the heat conductivity of the thin-film structure in the c-axis in the comparative example.

Additionally, according to a D. Cahill's model, in a case of a thin-film structure formed of $Bi_2Te_3$, a theoretical minimum value of heat conductivity of the thin-film structure in a c-axis is about 0.14 W/(m·K), and a theoretical minimum value of heat conductivity of the thin-film structure in an a-b axis is about 0.28 W/(m·K). According to a Slack model, in a case of a thin-film structure formed of $Bi_2Te_3$, a theoretical minimum value of heat conductivity of the thin-film structure in a c-axis is about 0.28 W/(m·K), and a theoretical minimum value of heat conductivity of the thin-film structure in an a-b axis is about 0.55 W/(m·K).

In the example, even though the thin-film structure 40 is formed of a material different from $Bi_2Te_3$, it may be understood that heat conductivity of the thin-film structure 40 in the c-axis is very close to the theoretical minimum value of the heat conductivity of the thin-film structure formed of $Bi_2Te_3$ in the c-axis which is obtained according to the D. Cahill's model or the Slack model.

If the thermoelectric structure 10 is used for a thermoelectric device, the thermoelectric structure 10 may be used in its original state, or a part of an element of the thermoelectric structure 10 may be separated or removed from the thermoelectric structure 10 so as to be used for the thermoelectric device.

For example, when the thermoelectric structure 10 is used for a thermoelectric device, the buffer layer 30 and the oxide substrate 20 may be separate from the thin-film structure 40, and the thin-film structure 40 may be included as a part of a configuration of the thermoelectric device.

Figure 11:
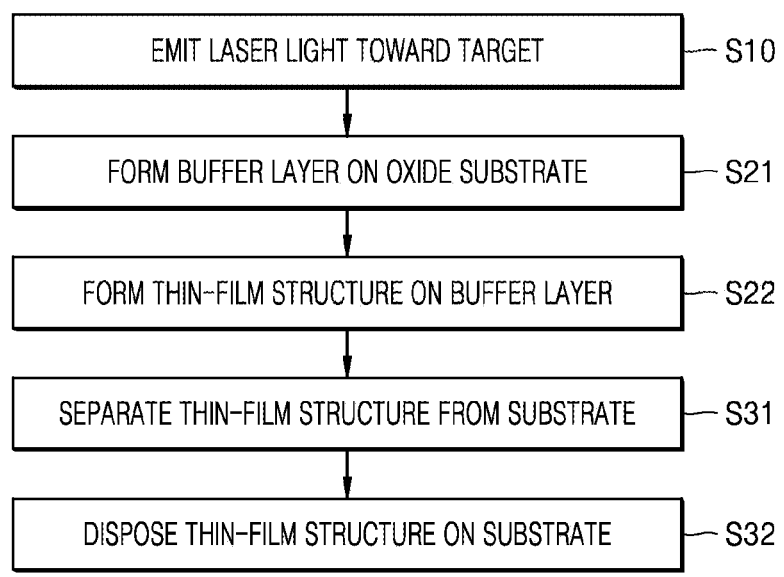
FIG. 11 is a flowchart illustrating a method of manufacturing the thermoelectric structure according to some example embodiments.
Figure 12:
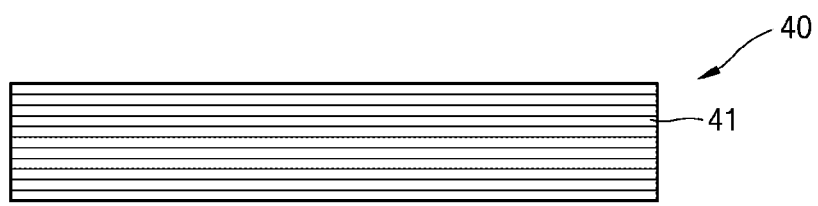
FIG. 12 illustrates a schematic diagram of a separated thin-film structure according to some example embodiments.
Figure 13:
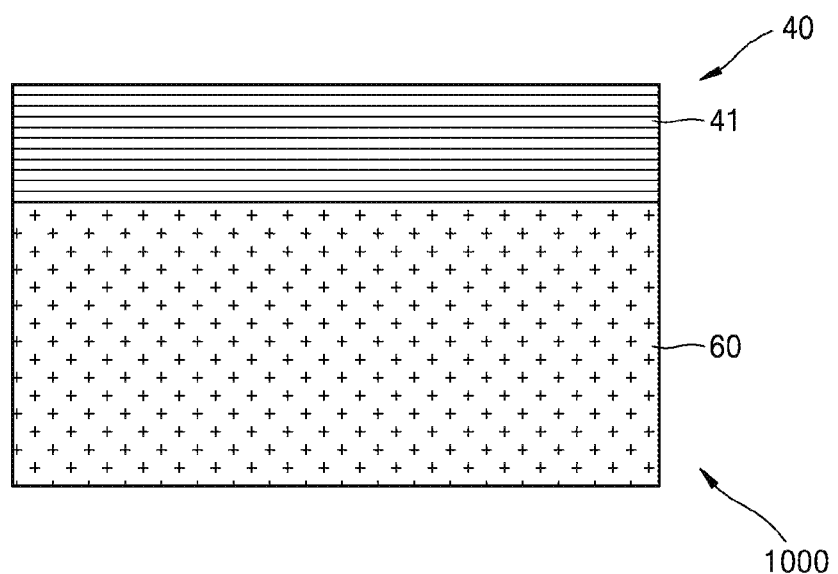
FIG. 13 illustrates a schematic diagram of a thermoelectric device in which the separated thin-film structure is disposed on a substrate according to some example embodiments.

FIG. 11 is a flowchart illustrating a method of manufacturing the thermoelectric structure 10, described with reference to in FIG. 3, according to some example embodiments. FIG. 12 illustrates a schematic diagram of the thin-film structure 40 that is separated from the buffer layer 30. FIG. 13 illustrates a schematic diagram of a thermoelectric device 1000 in which the separated thin-film structure 40 is disposed on a new substrate 60.

Referring to FIG. 11, the method of manufacturing the thermoelectric structure 10 may further include operations S31 and S32 in addition to operations S10, S21, and S22 described with reference to FIG. 3.

For example, in operation S31, the thin-film structure 40 formed on the buffer layer 30, as illustrated in FIG. 2, may be separated from the oxide substrate 20. The thin-film structure 40 may be separated from the buffer layer 30 and the oxide substrate 20. In some example embodiments, the thin-film structure 40 is separated from the buffer layer 30 on the oxide substrate 20, such that the buffer layer 30 remains on the oxide substrate 20. In some example embodiments, the thin-film structure 40 and buffer layer 30 are separated from the oxide substrate 20, such that the thin-film structure 40 remains on the buffer layer 30. In some example embodiments, the thin-film structure 40 may be separated from the buffer layer 30 subsequent to separating the thin-film structure 40 and buffer layer 30 from the oxide substrate.

Referring to FIG. 12, the thin-film structure 40 includes the plurality of thin-film layers 41. Heat conductivity (K) of the thin-film structure 40 in a direction of a thickness of the thin-film structure 40 may range from about 0.14 W/(m·K) to about 0.3 W/(m·K). Additionally, an FWHM of the thin-film structure 40 obtained by performing w-scanning may be equal to or less than about 0.1 degrees.

A method of separating the thin-film structure 40 from the buffer layer 30 may be variously modified. For example, the thin-film structure 40 may be separated from the buffer layer 30, by removing the buffer layer 30 by using an etching method. However, a method of separating the thin-film structure 40 from the buffer layer 30 is not limited thereto, and technology that is well-known to one of ordinary skill in the art may be variously employed.

In operation S32, the separated thin-film structure 40 may be placed on a separate substrate 60. The separate substrate 60 may include a material different from a material included in the oxide substrate 20. The separate substrate 60 may be a substrate that may be used for the thermoelectric device 1000. For example, the substrate 60 may be a sapphire substrate. As another example, the substrate 60 may be one of a gallium arsenide (GaAs) substrate, a silicon substrate, a glass substrate, and a quartz substrate. As another example, the substrate 60 may be a plastic substrate formed of polyethyleneterephthalate (PET), Polybutylene terephthalate (PBT), Polyethylene naphthalate (PEN), polybutylene naphthalate (PBN), polyethylene (PE), polypropylene (PP), polycarbonate (PC), or the like.

Although not shown in the drawing, the thermoelectric 1000 may further include an electrode electrically connected to the thin-film structure 40.

According to some example embodiments, a Te-based thin-film structure may be formed on an oxide substrate by using the thermoelectric structure, the thermoelectric device, and the method of manufacturing the same, by performing a pulsed laser deposition method under a certain condition. Thus, the Te-based thin-film structure having low heat conductivity may be simply manufactured.

Some example embodiments of the thermoelectric structure, the thermoelectric device, and the method of manufacturing the same have been described and shown in the attached drawings in order to gain a sufficient understanding of same. However, the example embodiments are only examples, and should not be construed as being limited to the descriptions set forth herein.

It should be understood that example embodiments described herein should be considered in a descriptive sense only and not for purposes of limitation. Descriptions of features or aspects within each example embodiment should typically be considered as available for other similar features or aspects in other example embodiments.

The foregoing description has been provided for purposes of illustration and description. It is not intended to be exhaustive or to limit the disclosure. Individual elements or features of a particular example embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of manufacturing a thermoelectric structure, the method comprising:
    emitting laser light toward a target to separate at least first and second portions of a material from the target, the target including tellurium (Te);
    forming a buffer layer based on depositing the first portion of the material on an oxide substrate, the buffer layer including tellurium oxide; and
    forming a thin-film structure based on depositing the second portion of the material on the buffer layer, the thin-film structure including Te.

2. The method of claim 1, wherein the emitting of the laser light includes emitting pulsed laser light, the pulsed laser light having a frequency ranging from about 0.5 Hz to about 4 Hz.

3. The method of claim 1, wherein the emitting of the laser light includes emitting the laser light using a krypton fluoride (KrF) excimer laser apparatus.

4. The method of claim 1, wherein emitting the laser light toward the target includes applying an amount of energy to the target using the laser light, the amount of energy being equal to or less than about 45 mJ.

5. The method of claim 1, wherein the forming of the thin-film structure includes forming a thin-film structure having a thickness of about 10 nm to about 100 nm within a period of elapsed time, the period of elapsed time being equal to or less than about 2 hours.

6. The method of claim 1, wherein the thin-film structure has a heat conductivity in a direction of a thickness of the thin-film structure, the heat conductivity ranging from about 0.14 W/(m·K) to about 0.3 W/(m·K).

7. The method of claim 1, wherein the thin-film structure has a full width at half maximum (FWHM) that is equal to or less than about 0.1 degrees.

8. The method of claim 1, wherein the target further includes at least one of bismuth (Bi), antimony (Sb), and selenium (Se).

9. The method of claim 1, wherein,
    the thin-film structure includes a plurality of thin-film layers, and
    the plurality of thin-film layers are stacked in a direction of a thickness of each of the plurality of thin-film layers.

10. The method of claim 9, wherein each of the plurality of thin-film layers include $Bi_{0.5}Sb_{1.5}Te_3$.

11. The method of claim 1, wherein,
    the buffer layer includes,
    a first buffer layer on the oxide substrate, the first buffer layer including tellurium oxide, and
    a second buffer layer on the first buffer layer, the second buffer layer including Te.

12. The method of claim 1, wherein the buffer layer has a thickness ranging from about 0.2 nm to about 2 nm.

13. The method of claim 1, further comprising:
separating the thin-film structure from the buffer layer.

14. The method of claim 13, further comprising:
placing the separated thin-film structure on a separate substrate, the separate substrate including a material that is different from oxide substrate.

* * * * *